United States Patent
Kakkar et al.

(10) Patent No.: US 12,014,205 B2
(45) Date of Patent: Jun. 18, 2024

(54) ADVANCED REGISTER MERGING

(71) Applicant: Synopsys, Inc., Mountain View, CA (US)

(72) Inventors: Navneet Kakkar, Bangalore (IN); Sridhar Keladi, Bangalore (IN); Diptanshu Ghosh, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 557 days.

(21) Appl. No.: 17/217,110

(22) Filed: Mar. 30, 2021

(65) Prior Publication Data
US 2021/0303336 A1    Sep. 30, 2021

(30) Foreign Application Priority Data

Mar. 31, 2020    (IN) .............................. 202041014214

(51) Int. Cl.
| | |
|---|---|
| *G06F 30/327* | (2020.01) |
| *G06F 9/46* | (2006.01) |
| *G06F 30/3308* | (2020.01) |
| *G06F 30/3323* | (2020.01) |

(52) U.S. Cl.
CPC ............ *G06F 9/466* (2013.01); *G06F 30/327* (2020.01); *G06F 30/3308* (2020.01); *G06F 30/3323* (2020.01)

(58) Field of Classification Search
USPC ........................................................ 716/104
See application file for complete search history.

(56) References Cited

U.S. PATENT DOCUMENTS

| | | | |
|---|---|---|---|
| 2007/0028204 A1* | 2/2007 | Takeda ................ | G06F 30/3323 716/103 |
| 2015/0100929 A1* | 4/2015 | Redekopp ............. | G10L 19/032 716/103 |

OTHER PUBLICATIONS

Mishchenko, A., et al., "Scalable and Scalably-Verifiable Sequential Synthesis," ICCAD 2008 IEEE/ACM International Conference on Computer-Aided Design, pp. 234-241 (2008).
Kuehlmann, A., et al., "Equivalence Checking," Chapter 4 in *Electronic Design Automation for IC Implementation, Circuit Design, and Process Technology*, (Lavagno et al., eds.), pp. 77-108 (2016).

* cited by examiner

*Primary Examiner* — Bryce M Aisaka
(74) *Attorney, Agent, or Firm* — Lowenstein Sandler LLP

(57) ABSTRACT

Disclosed herein are computer-implemented method, system, and computer-program product (non-transitory computer-readable storage medium) embodiments for advanced register merging. A first register-merging operation may be configured to merge, into a first survivor register, a first plurality of registers of the RTL description. A second register-merging operation configured to merge, into a first equivalence class, a second plurality of registers that share a first functional equivalency based on output of the first register-merging operation. Any register in the first equivalence class as noted here may in turn be non-equivalent to any register in the second equivalence class. Equivalence of registers in a given class may be verified using simulations or satisfiability checks.

30 Claims, 17 Drawing Sheets

ADVANCED REGISTER MERGING

RELATED APPLICATION

This application claims the benefit of Indian Provisional Patent Application No. 202041014214, filed Mar. 31, 2020, the entirety of which is incorporated by reference herein.

TECHNICAL FIELD

The present disclosure relates generally to a logic synthesis system. In particular, the present disclosure relates to a system and method for providing advanced register merging.

BACKGROUND

Equivalence determinations may range from a simple net-based equivalence to a sophisticated functional equivalence of register inputs. The latter is needed to determine all the complex equivalences but may be expensive in runtime. So, a pragmatic solution is needed, to find more equivalences with less runtime overhead. Further, all equivalences found by synthesis should be formally verifiable.

SUMMARY

Provided herein are examples of system, method, and/or computer program product embodiments, and/or combinations and sub-combinations thereof, for advanced register merging as relates generally to logic synthesis.

In some embodiments, a computer-implemented logic-synthesis method may involve loading, via at least one computer processor, a register-transfer level (RTL) description.

A first register-merging operation may be configured to merge, into a first survivor register, a first plurality of registers of the RTL description. The first register-merging operation may be performed via the at least one computer processor, according to some embodiments.

A first result of the first register-merging operation may be output by the at least one processor as a first output. This first output may include the first survivor register, being a result of the first register-merging operation.

A second register-merging operation may be configured to merge, into a first equivalence class, a second plurality of registers that share a first functional equivalency based on the first output. The second register-merging operation may be performed via the at least one computer processor, according to some embodiments.

A third register-merging operation may be configured to merge, into a second equivalence class, a third plurality of registers that share a second functional equivalency based on the first output. Any register in the first equivalence class as noted here may in turn be non-equivalent to any register in the second equivalence class. The third register-merging operation may be performed via the at least one computer processor, according to some embodiments.

Equivalence of the second plurality of registers within the first equivalence class may be verified, such as using any of different types of checks and/or in accordance with a given ordering, e.g., a topological ordering. The checks may include satisfiability checks or simulations. In response to the verifying, a second output may be output. The second output may include at least the first equivalence class and a second survivor register, for example.

A satisfiability check may be performed in response to a random simulation, as part of the verifying. At least one register pair may be selected from the third plurality of registers, and the satisfiability check may be skipped for the at least one register pair.

At least one of the first plurality of registers or a fourth plurality of registers may be determined to be independent of the second plurality of registers, in accordance with a topological ordering. Here, the satisfiability check may be run with respect to and the at least one of the fourth plurality of registers or the first plurality of registers determined to be independent of the second plurality of registers, in parallel with running the satisfiability check with respect to the second plurality of registers.

The third plurality of registers may be determined to be mutually dependent with the second plurality of registers, and at least one of a fourth plurality of registers or the first plurality of registers may be determined to be independent of the second plurality of registers or the third plurality of registers, in accordance with a topological ordering. Per an indication that satisfiability of one of the second plurality of registers or of the third plurality of registers is to be evaluated, the satisfiability check may be run with respect to both the third plurality of registers and the second plurality of registers, skipping the satisfiability check with respect to the fourth plurality of registers or the first plurality of registers determined to be independent of the second plurality of registers or the third plurality of registers.

At least one register pair from the second plurality of registers may be classified as functionally equivalent. The classifying may include determining a shared clock for the at least one register pair, determining an equivalent response to a synchronous function for the at least one register pair, and determining an equivalent response to an asynchronous function for the at least one register pair, where any of the operations of determining may be performed via the at least one computer processor.

The first plurality of registers may share a net in common based on the RTL description. The second output may include at least one of a second RTL description, a gate-level hardware description, a serialized bit sequence, a parallel-channel input, or a combination thereof, according to some embodiments.

This Summary does not attempt to provide the complete significance of any particular innovation, embodiment, or example as it may be used in commerce. Additionally, this Summary is not intended to signify key or critical elements of an innovation, embodiment or example or to limit the scope of the subject matter of this disclosure. The innovations, embodiments, and/or examples found within this disclosure are not all-inclusive, but rather describe the basic significance of the subject matter. Accordingly, one use of this Summary is as a prelude to a Detailed Description presented below.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

In the figures, reference signs may be omitted as is consistent with accepted engineering practice. However, a skilled person will understand that the illustrated components are readily understood when viewed in context of the illustration as a whole and the accompanying disclosure describing such various figures.

DETAILED DESCRIPTION

Aspects of the present disclosure relate to advanced register merging, such as for logic synthesis.

Merging of equivalent registers is a technique of synthesis tools to improve area usage and power consumption. Once a group of equivalent registers is found, one of the equivalent registers may be chosen as a survivor register. Loads on the other registers in the group are transferred to the survivor register. The unloaded registers may then be eliminated.

Determining equivalence of registers is generally needed for register merging. Designs may contain complex equivalences involving feedbacks, dependent equivalences, composed equivalence of data and control, etc. Identifying these equivalences and merging the registers may provide area reduction and power reduction.

Figure 1:
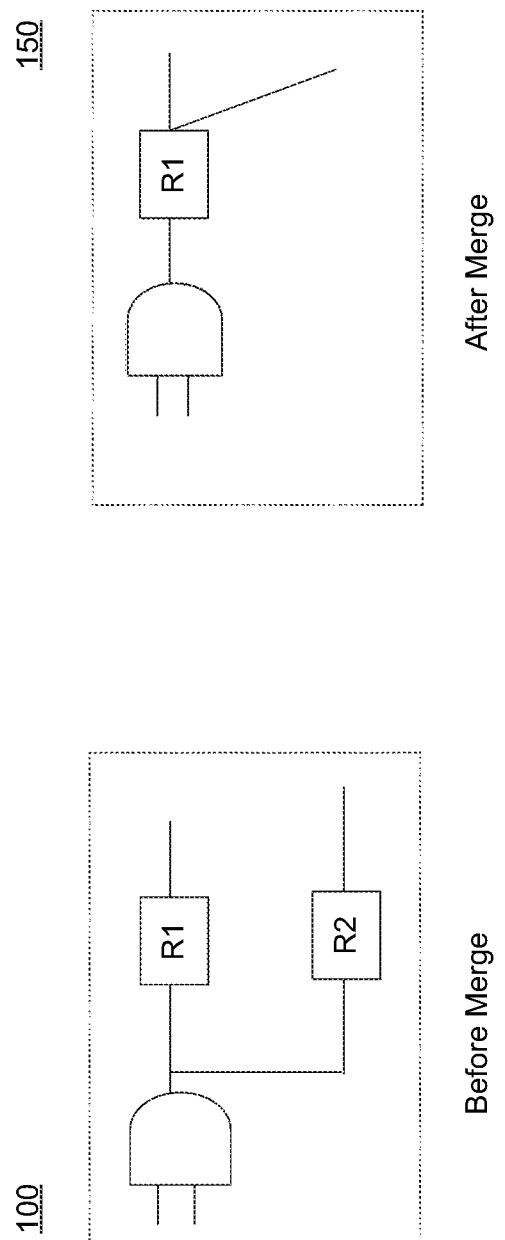
FIG. 1 illustrates an example of net-based register merging.

FIG. 1 illustrates an example of net-based register merging. In FIGS. 1, R1 and R2, shown on the left-hand side (100) before register merging, are found equivalent. R1 is chosen as the survivor register, shown on the right-hand side (150) after register merging, where the load of R2 is transferred to R1, and R2 is eliminated.

Net-Based Solution

A logic synthesis system may follow a net-based solution to register equivalence. Two registers may be considered equivalent if the net driving data pins are the same and net driving controls (e.g., reset) are the same across two registers. This may not identify functional and other complex equivalences.

Figure 2:
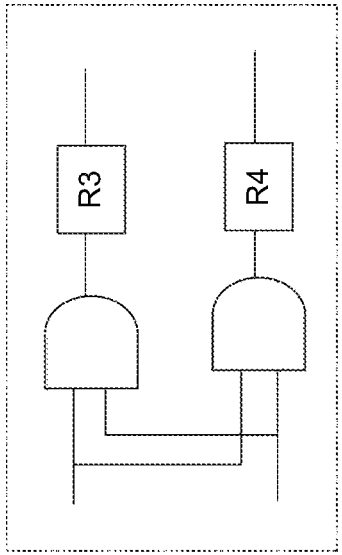
FIG. 2 illustrates an example of equivalent registers alongside an example of non-equivalent registers, according to some use cases.
Figure 2:
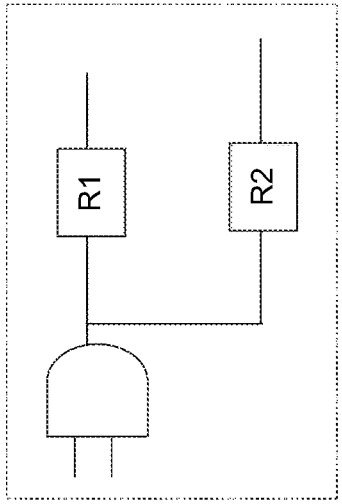

FIG. 2 illustrates an example of equivalent registers alongside an example of non-equivalent registers, according to some use cases. In FIG. 2, R1 and R2, shown on the left-hand side (200) are driven by the same net and hence are found equivalent. R3 and R4, shown on the right-hand side (250) are driven by different nets and hence not found as equivalent. But notice that, the nets driving R3 and R4 are functionally equivalent and hence R3 and R4 may be merged. The net-based solution is generally not capable of determining this equivalence.

Complex Equivalences not Handled by Net-Based Solution

Figure 3:
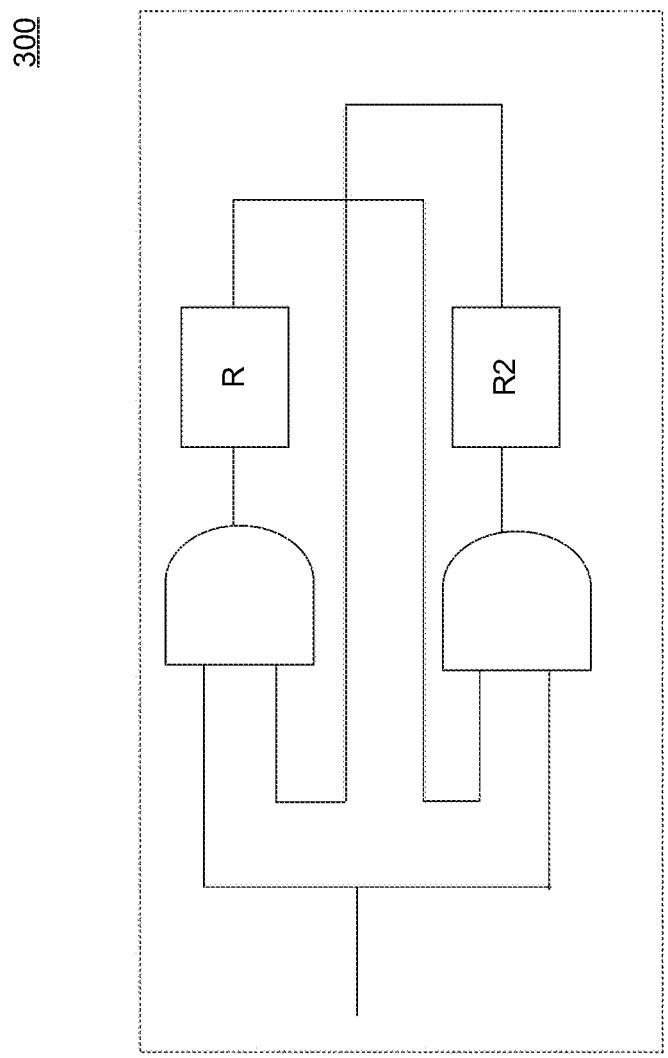
FIG. 3 illustrates an example of a driver cone with feedback, according to an example use case.

FIGS. 3-6 show example complex equivalences seen in real designs. None of such functional equivalences are found by the net-based solution and may therefore need more sophisticated functional equivalence checks briefly described as follows:

FIG. 3 shows an example of an equivalent driver cone with feedback, according to some embodiments.

Figure 4:
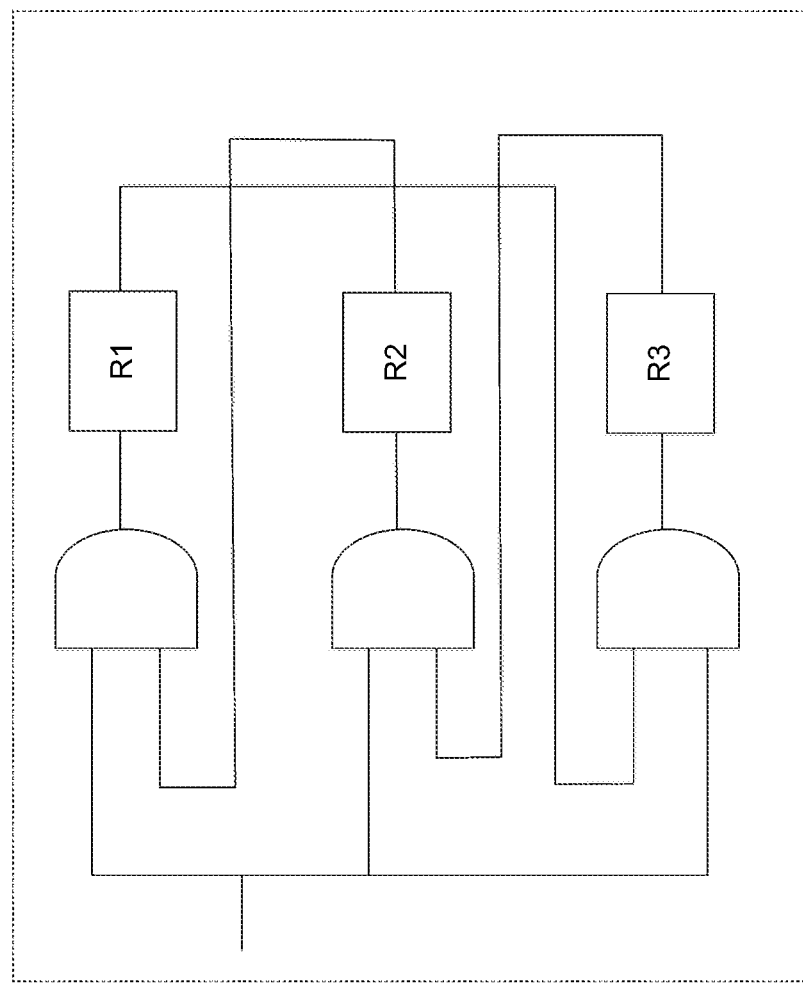
FIG. 4 illustrates an example of a complex equivalence across more than two registers, according to an example use case.

FIG. 4 illustrates an example of a complex equivalence across more than two registers, according to an example use case. Equivalence involving more than two registers as shown in FIG. 4 among R1, R2, and R3 may be found when analyzed together but not when analyzed pair-wise.

Figure 5:
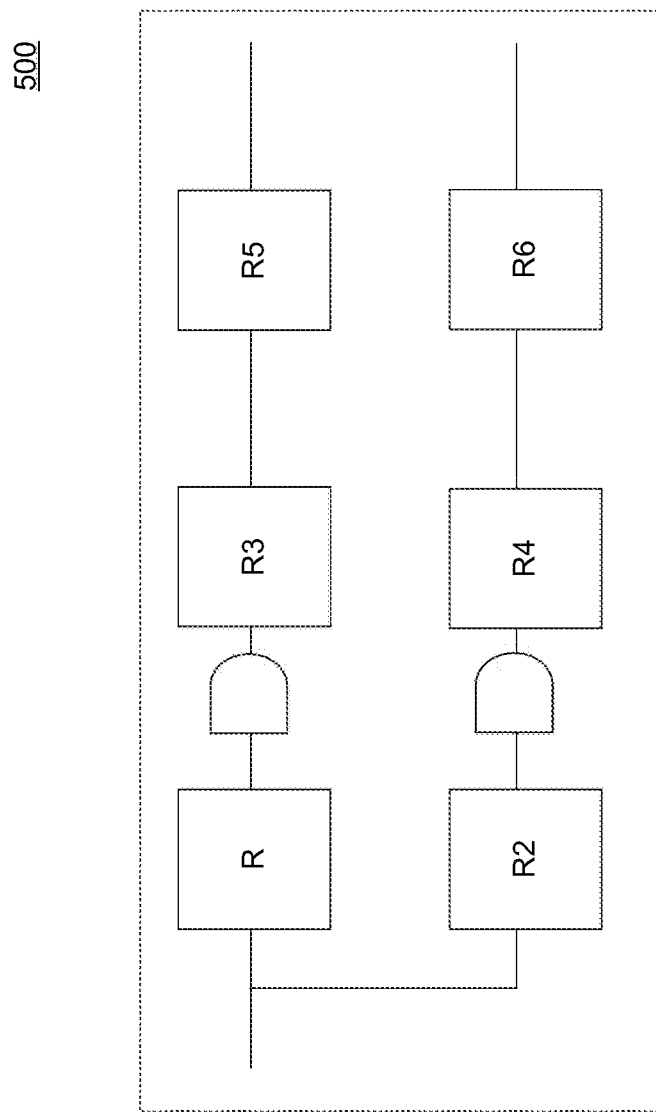
FIG. 5 illustrates an example of a chain of dependent equivalences, according to an example use case.

FIG. 5 illustrates an example of a chain of dependent equivalences, according to an example use case. In FIG. 5, {R5, R6} equivalence depends on {R3, R4} equivalence, which in turn may depend on {R1, R2} equivalence, as shown in FIG. 5.

Figure 6:
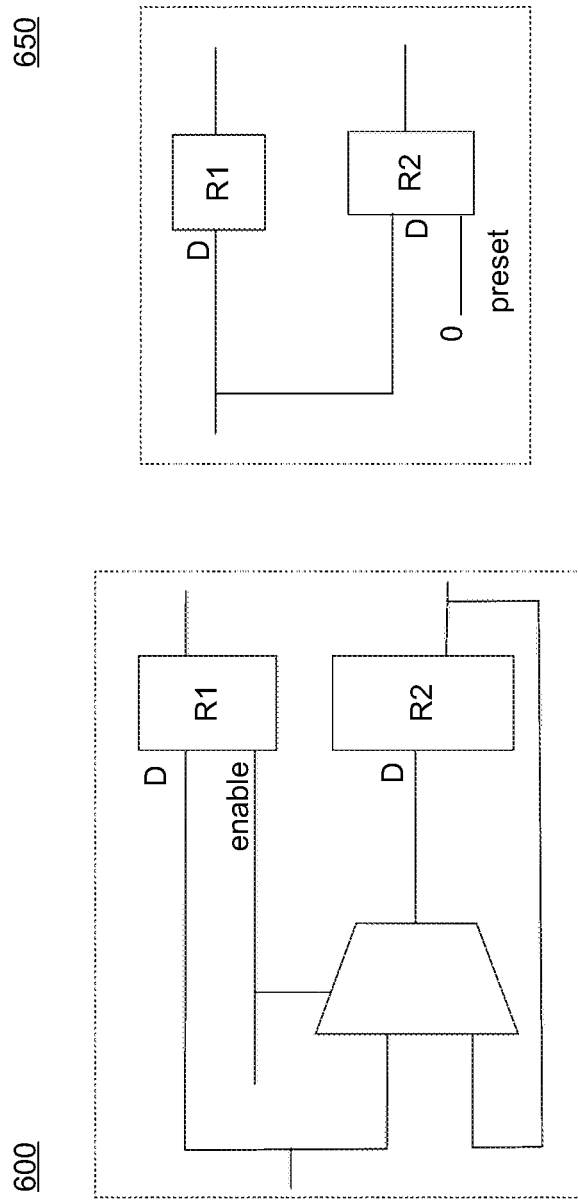
FIG. 6 illustrates an example of equivalent configurations of a data input and a control input, according to an example use case.

FIG. 6 illustrates an example equivalent configurations of a data input and a control input, according to an example use case. In FIG. 6, equivalence may be found only as a function of both data inputs (D) and control inputs (enable, preset) considered together (not individually), as shown separately in FIGS. 6 (600 and 650), including certain assumptions (e.g., fixed '0' preset in 650).

Register Correspondence

Formal equivalence checking requires an indication register correspondence. The solution, such as in the form of an example process described here, may handle all complex correspondence or equivalences of registers.

An equivalence class or partition contains equivalent registers. An underlying concept of equivalence classes or partitions is to assume all registers therein to be equivalent, then iteratively refining evaluations of equivalence to determine the final (correct) equivalences.

Registers with different initial states (0/1) are not considered equivalent. Hence, two equivalent classes are formed based on initial states. A process (such as using an algorithm or repeated sequence of steps with conditional branches, for example) may be applied on each of the two partitions independently. Pseudocode representing such a process is shown below, to show a non-limiting example. In other embodiments, operations of such processes may be implemented using other code, pseudocode, or various algorithms.

Figure 7:
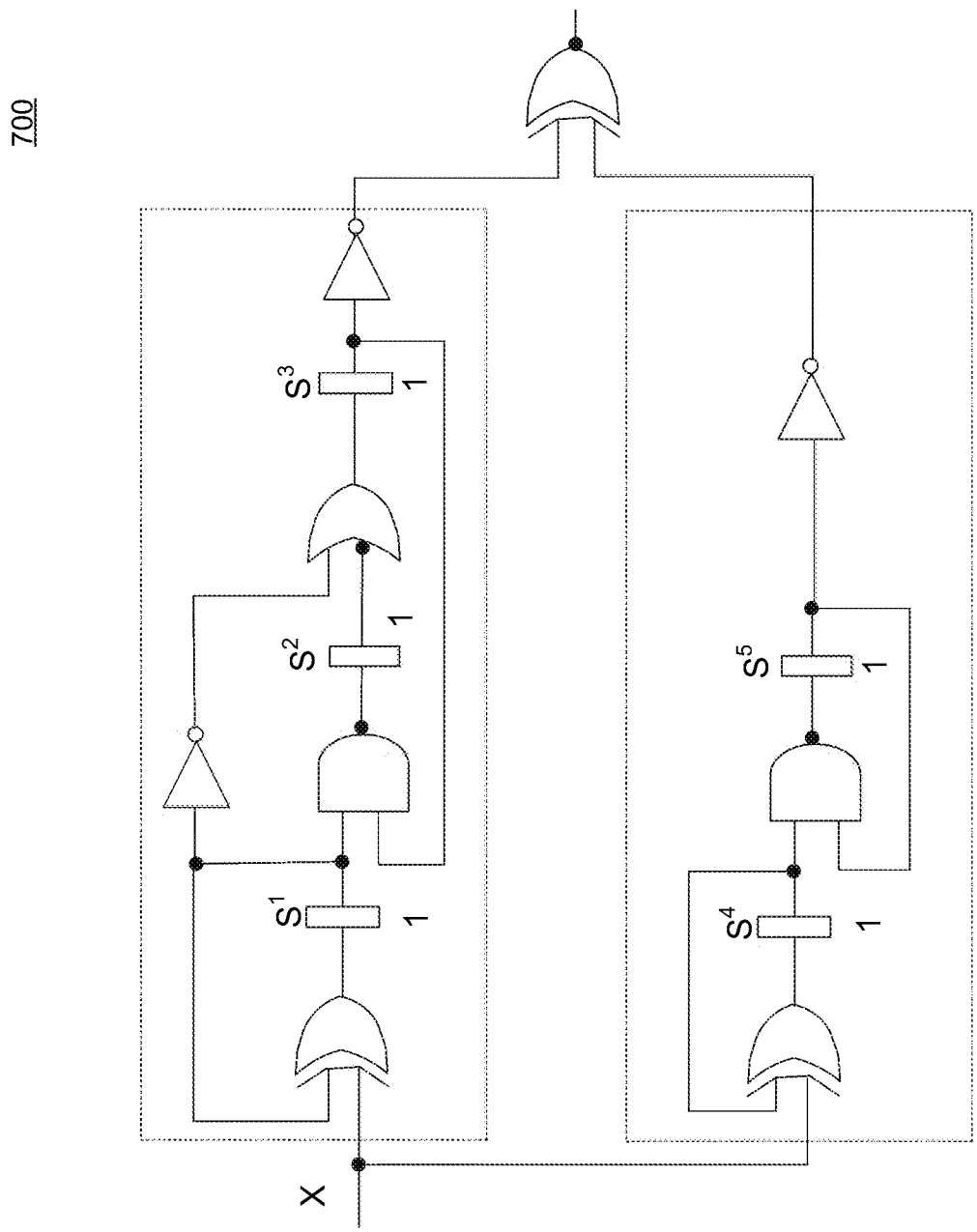
FIG. 7 illustrates an example circuit design for advanced register merging, as a given use case according to some example embodiments.
Figure 8:
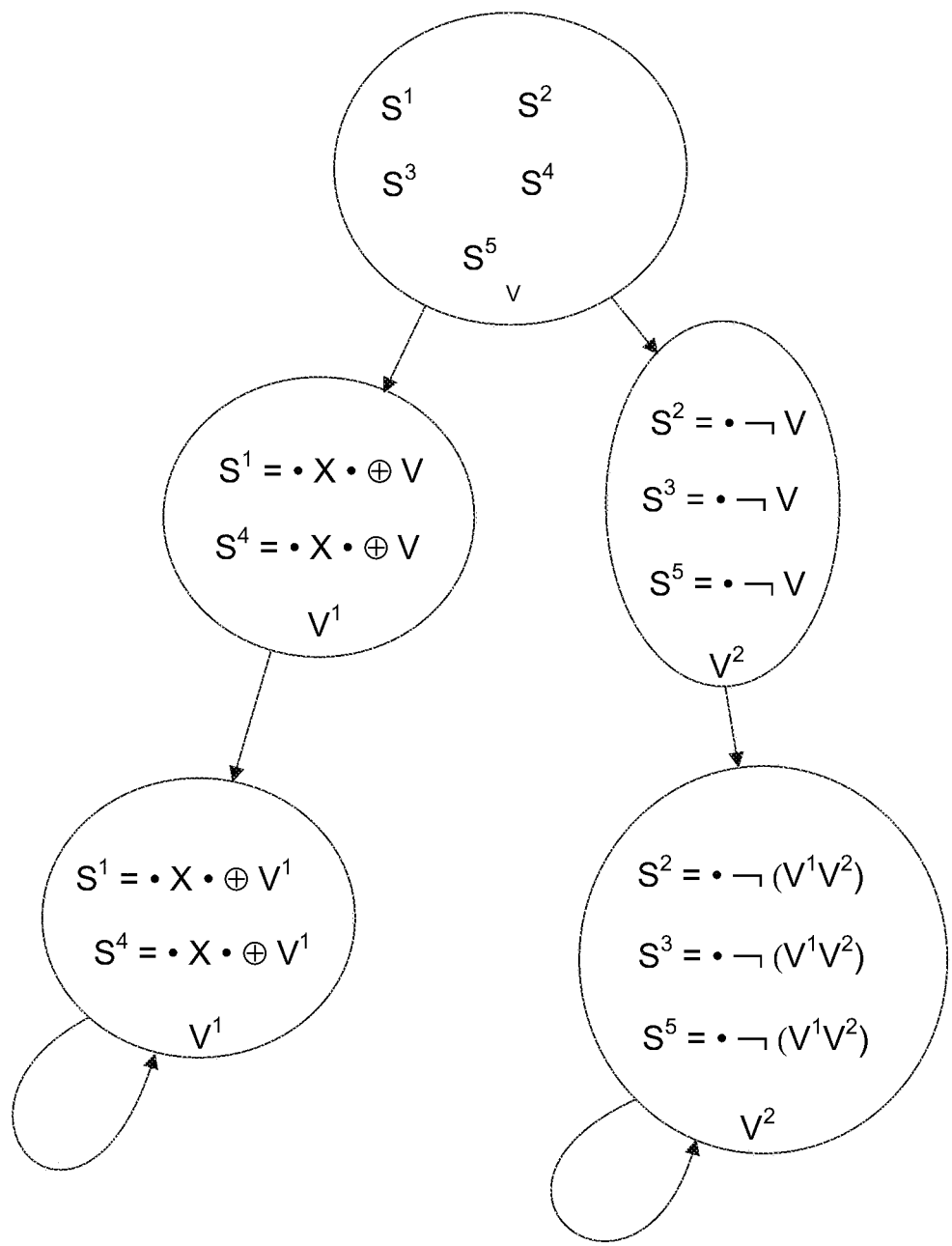
FIG. 8 illustrates a logic function corresponding to the advanced register merging of the example circuit design of FIG. 7, according to some example embodiments.

Listing 1
  Assume all registers in same equivalence class;
  do
    Assign one variable per equivalence class; This variable is
    assigned to the outputs of all registers within that class;
    For all registers, build the input function;
    Within each class, compare the registers pair-wise for functional equivalence;
    Form new equivalence classes based on the compare results;
  while new equivalence classes are found;

The example process represented in Listing 1 may be applied to a sample circuit design shown in FIG. 7 and the corresponding logic function shown in FIG. 8. These examples are explained further below.

The circuit depicted in the example of FIG. 7 contains five (5) registers $s^1, s^2, s^3, s^4, s^5$.

Initially, all five registers may be assumed to belong to the same equivalence class. This is the top node containing all five registers and a single variable v is assigned to them, in accordance with this example use case.

As represented in FIG. 8, a logic function may accept register descriptions, such as in a register-transfer level (RTL) format, as inputs and compare the inputs pair-wise. The results may be refined to two equivalence classes $\{s^1, s^4\}, \{s^2, s^3, s_5\}$, in an example use case according to this embodiment.

As new equivalence classes are found, the new equivalence classes may each be assigned different variables, e.g., $v^1$ and $v^2$, in some embodiments.

The logic function may be built or iterated for all register inputs again and compared pair-wise (within equivalence classes). Though the functions may change, the equivalence classes may remain the same in this case.

Having iterated across a given set of inputs, the process may terminate. Resulting equivalence classes may be final and correct, for some use cases.

Advanced Register Merging in Logic Synthesis

As explained previously, register correspondence may be targeted at formal verification for some use cases, irrespective of its implementation. By contrast, discussed further herein is a runtime-efficient implementation of a suitable register-correspondence evaluation process to find complex equivalences for register merging in synthesis, according to some example use cases. This enhanced technology may be referred to as advanced register merging, at least for purposes of this disclosure.

Aspects of the present disclosure relate to advanced register merging to achieve relatively high degrees of register merging. Runtime efficiencies may be leveraged to increase performance and functionality of electronic design automation (EDA) tools on various platforms. As a further result of leveraging these efficiencies to reduce or eliminate more complex equivalences, circuits may be designed to occupy less area and consume less power for equivalent or better performance and functionality over previous circuit designs.

Equivalence of a Register Pair
Synchronous Input Function (f_Sync)
  $f$_sync may be a logic function created by composing the logic feeding to various synchronous (sync) input pins of the register.
  Typical sync input pins are sync datain, sync preset, sync clear and sync enable.
  Example: consider a register R with sync datain=d, sync enable=e and output=q; Then, f_sync(R)=(e & d|e' & q). In other words, the value of register R may be the value of sync datain d if sync enable is active, or the value of register R may be the output q if sync enable is inactive.

Asynchronous Input Function (f_Async)
  $f$_async may be a logic function created by composing the logic feeding to various asynchronous (async) input pins of the register.
  Typical async input pins are async preset and async clear.
  For a given pair of registers, R1 and R2, these registers may be considered equivalent if the following three conditions are true:
    R1's Clock==R2's Clock
    $f$_sync(R1)==$f$_sync(R2)
    $f$_async(R1) $f$_async(R2)

Equivalence of Two Functions

As has been observed, both sync and async input functions of two registers have to correspondingly match for them to be equivalent. Some approaches may create two separate partitions upfront based on the initial states (0/1). By contrast, applying the enhanced techniques described herein, the determinations of equivalence may be achieved by steady-state iterations of a process itself for advanced register merging. Composed input functions may automatically result in separating the registers that may not have same initial states.

Figure 9:
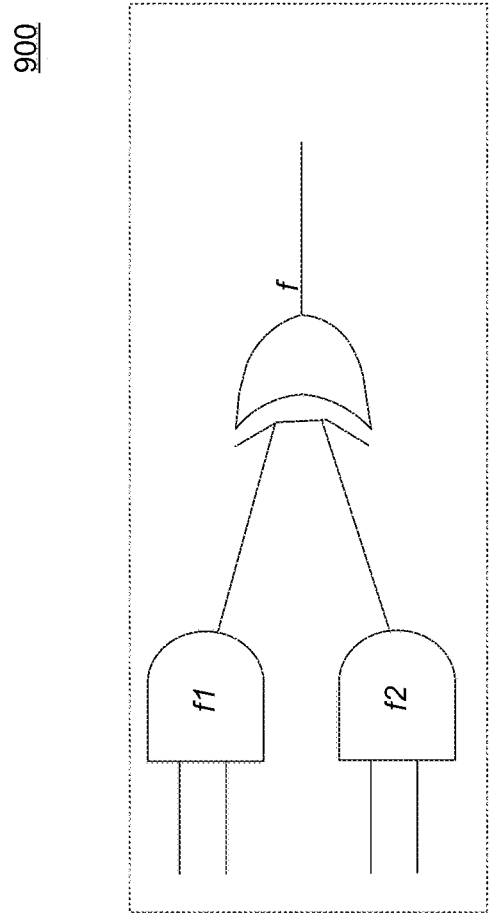
FIG. 9 illustrates an example relationship of input functions with respect to a new function as part of an equivalence test, according to some example embodiments.

FIG. 9 illustrates an example relationship of input functions with respect to a new function as part of an equivalence test, in some example embodiments. As part of the enhanced techniques disclosed herein, two functions may be compared by XOR'ing the two input functions $f1$ and $f2$ to form a new function $f$. If $f$ produces 1 for any input set, it means, $f1$ and $f2$ are not equivalent. Random simulation and satisfiability techniques may be suitable for this comparison, in some embodiments of the enhanced techniques disclosed herein.

In random simulation, a series of random input vectors may be applied. If any of the input vectors results in $f=1$, then $f1$ and $f2$ are not equivalent. If $f$ is 0 for all test vectors, it does not guarantee them to be equivalent. In some cases, the random vector set may have only a subset of all possible input values. Random simulation may be relatively fast for a given number of inputs, which may be randomly selected.

When random simulation has found two functions equal, a satisfiability check may be applied to confirm such functional equivalence. A function is termed satisfiable if there exists an input that produces a logic 1 for the function. If $f$ is not satisfiable, then $f1$ and $f2$ are equivalent. Generally, satisfiability checks may be slow and may negatively affect overall runtime or performance of EDA tools, for example.

Run-Time Reduction

It is generally advantageous to reduce the run time of the equivalence check. For this purpose, a variety of techniques may be used together. For example, a net-based process may be used to determine equivalences of relatively low complexity, and to merge the registers. This may reduce the input set to a functional equivalence evaluation.

Whenever two registers may be compared for equivalence during a process for advanced register merging, it may not always be necessary to submit the registers to both the random simulation and satisfiability checking. Instead, the input set of the registers may be computed. If the inputs are different, then the two registers may be quickly determined to be not equivalent, thereby saving simulation and satisfiability runtimes.

To speed up a functional-equivalence evaluation process, it may be beneficial to apply such processes in two phases, as described further below.

In a functional-equivalence process, once the input logic functions of registers in a partition are built, pair-wise comparison may be used to disprove any assumed equivalence. Under some approaches, the number of comparisons may grow quadratically with respect to the number of registers in the partition. Further, each comparison may be runtime intensive, and more so for satisfiability checks. So, when partition sizes are relatively large, some such approaches may be detrimental to runtime.

In some embodiments, random simulation may be followed by satisfiability for each candidate pair of registers to determine functional equivalence. Compared to some approaches with large initial partitions, resulting in large runtime penalties for satisfiability checks, the enhanced techniques disclosed herein may repeat a two-phase process for evaluation of functional equivalence, which may reduce runtime over some techniques.

Figure 10:
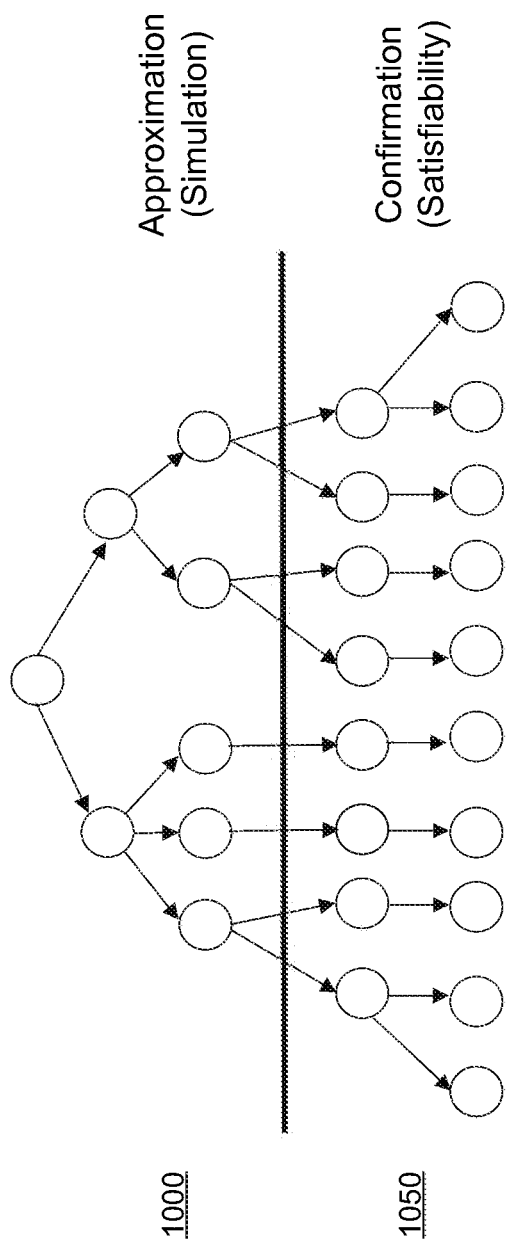
FIG. 10 illustrates a multi-phased approach to equivalence testing, according to some example embodiments.

FIG. 10 illustrates a multi-phased approach to equivalence testing, according to some embodiments of the enhanced techniques described herein. In a first phase (approximate phase—phase 1000 shown above the horizontal line in FIG. 10), equivalences may be determined based on fast random simulation, using one or more register-merging operations. The partitions or classes created by this phase may be relatively small. Registers in different classes (e.g., a first equivalence class and a second equivalence class, such as resulting from different register-merging operations, e.g., first, second, or third register-merging operations) may be guaranteed to be non-equivalent, while registers in the same class may or may not be equivalent with other registers in the same class.

On the smaller, final equivalence classes, the same or similar processes or steps thereof may be repeated as a confirmation phase (phase 1050 shown below the horizontal line in FIG. 10). In this phase, fast random simulation may be followed by slow satisfiability checks. Final resultant classes may represent correct equivalences. In most cases, the input classes for slow satisfiability checks may be small enough to avoid excessive run time.

Avoiding Redundant Re-Evaluations

The confirmation phase, as noted above, may be runtime-intensive due to running satisfiability checks. The confirmation phase may start with a set of initial partitions and iteratively refine (break) the partitions to reach final partitions containing equivalent registers.

Whenever a partition P is split, RTL equations of registers in other partitions may be reconstructed, and equivalences may be re-evaluated. Some approaches may require re-evaluation of every other partition for a change in P. However, some such approaches may require significant overhead for processing and/or storing data, potentially also increasing the amount of time required to complete a synthesis operation and any larger EDA workflow of which the synthesis may be a part (e.g., compilation). In order to mitigate such problems, the advanced techniques described herein may allow for partitions having no dependency on P to be omitted from re-evaluation, saving runtime and compute resources.

The following approach may be used to achieve at least some of the advantages noted herein: before the confirmation phase, a dependency ordering of partitions may be determined. For example, in FIG. 11 (described further below), partition P2 depends on partition P1 (denoted as P1→P2, with arrows depicted in FIG. 11) if a given register in P1 fans out to a corresponding given register in P2. If partitions are mutually dependent, then they may be kept together. This is known as a partition group and is shown here denoted as (P3, P4).

In a topological order, each partition group may be evaluated. If a partition group contains more than one partition, e.g., (P3, P4), then breaks to P3 will re-evaluate P4, and vice-versa. Evaluating in topological order provides for re-evaluation when necessary, but may avoid re-evaluation when not necessary.

Ordering of partitions may provide an opportunity to run independent partitions (or independent partition groups) in parallel to further speed up the process.

Figure 11:
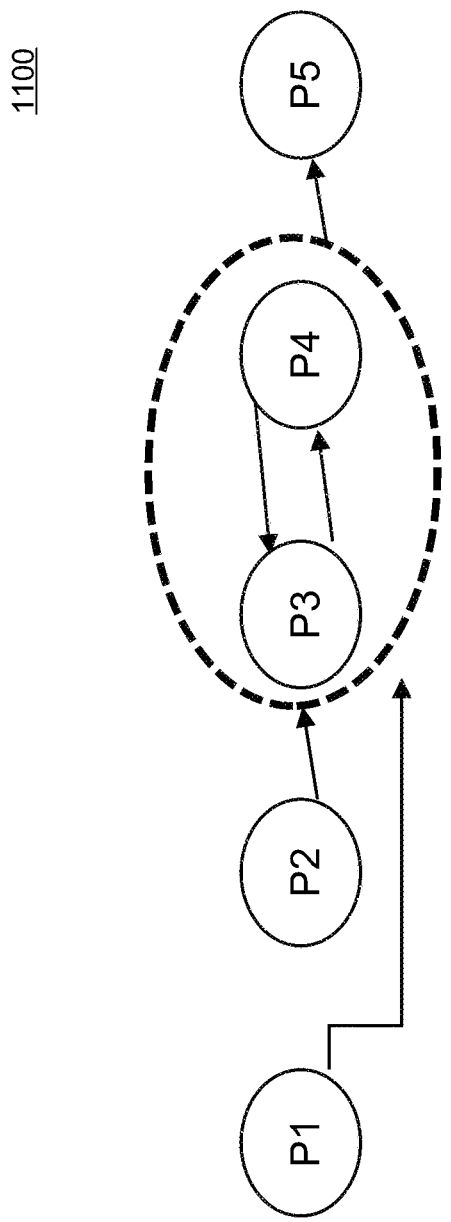
FIG. 11 illustrates an example dependency graph of five partitions, according to an example use case.

FIG. 11 illustrates an example dependency graph of five (5) partitions, according to an example use case. In this representation, there are four (4) partition groups: (P1), (P2), (P3, P4), and (P5). P3 and P4 have a mutual dependency. Accordingly, they are grouped together as (P3, P4) shown in a dotted oval. (P1) and (P2) are independent of each other, allowing for each to be evaluated in any order or in parallel.

Partition groups having a dependency may be evaluated sequentially. For example, because (P5) is dependent on (P3, P4), it follows that (P5) may be evaluated only after (P3, P4) has been evaluated. In this example of FIG. 11, the order of evaluation for the example partition-dependency may be as follows:

1. (P1) and (P2): May be in any order or in parallel;
2. Partition group (P3, P4): Any change to P3 may thereby trigger a requirement for re-evaluation of P4, and vice-versa;
3. (P5).

Results

In this section, runtime comparison of the above-described processes are shown empirically with respect to real designs with and without the enhanced techniques. These enhanced techniques may include a combination of a net-based process as a preprocess to reduce simulation, followed by more sparing use of satisfiability calls by first comparing input sets, in a two-phase approach to lower the number of necessary satisfiability calls. By contrast, Table 1 shows a comparison of advanced register merging against techniques that lack advanced register merging. For example, tests have been run by themselves against the same designs demonstrate runtime inefficiency of the conventional techniques, contrasting the improved runtime results of the enhanced techniques disclosed herein, as applied in practical experiments with RTL input based on real-world circuit designs.

TABLE 1

| Designs | Run Time (in seconds) without Advanced Register Merging | Run Time (in seconds) with Advanced Register Merging |
| --- | --- | --- |
| Design 1 | 6745 | 33 |
| Design 2 | 738 | 18 |
| Design 3 | 1206 | 36 |
| Design 4 | 3726 | 129 |
| Design 5 | 2435 | 149 |
| Design 6 | 45047 | 106 |
| Design 7 | 6503 | 26 |
| Design 8 | 227 | 89 |

The above example also shows how it may be preferable for a synthesis tool to reduce or eliminate register redundancies in netlists. Net-based equivalence techniques may not be sufficient to recognize complex equivalences seen in many designs. By contrast, a runtime-efficient implementation of register correspondence evaluations in synthesis, such as the disclosed advanced register merging to achieve relatively high degrees of register merging, may leverage runtime efficiencies to increase performance and functionality of EDA tools on various platforms. As a further result of leveraging these efficiencies to reduce or eliminate more complex equivalences, circuits may be designed to occupy less area and consume less power for equivalent or better performance and functionality over previous circuit designs.

Figure 12A:
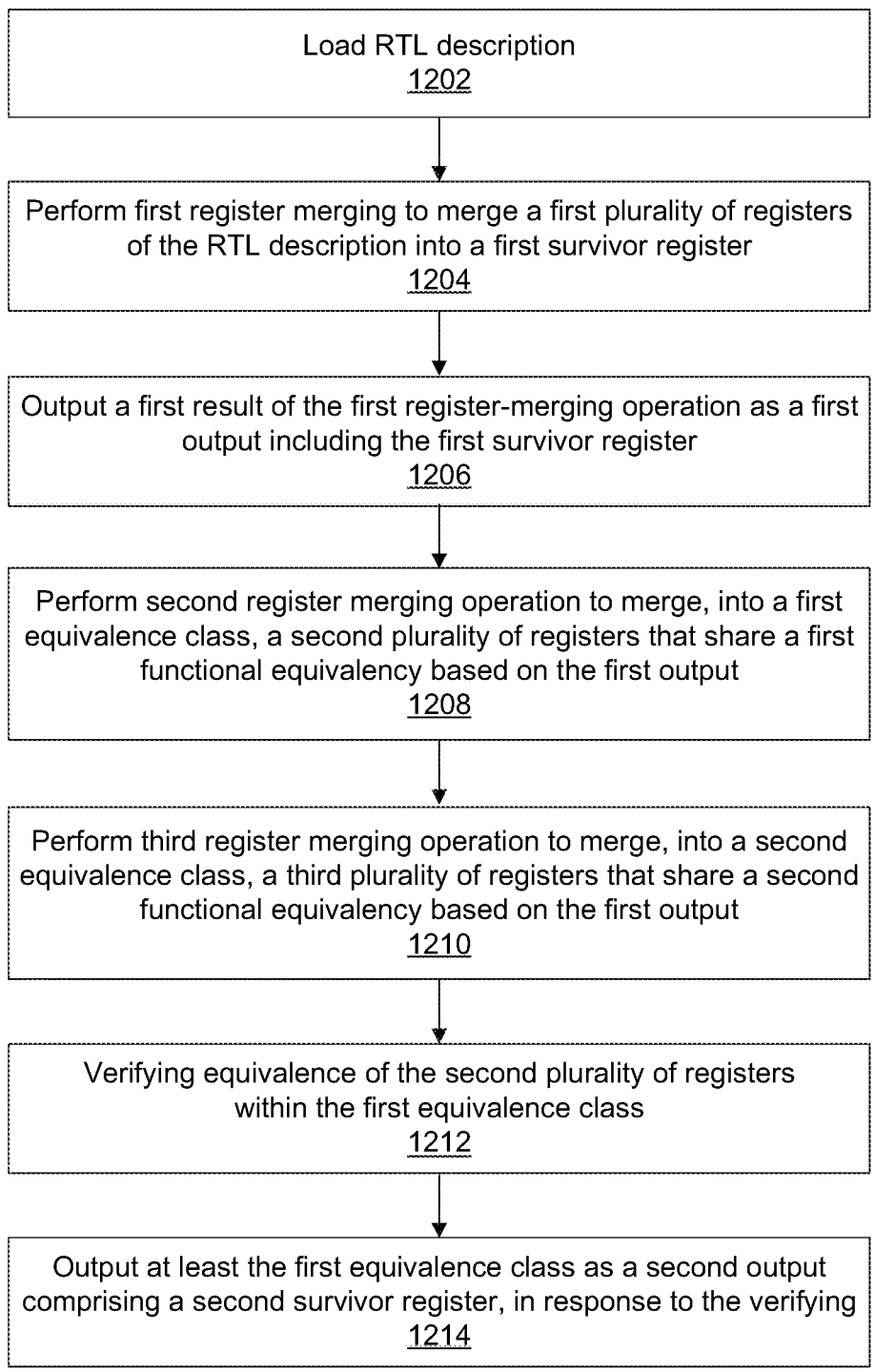
FIGS. 12A-12C are flowcharts illustrating example logic-synthesis processes or methods implementing advanced register merging, according to some embodiments of the present disclosure.
Figure 12B:
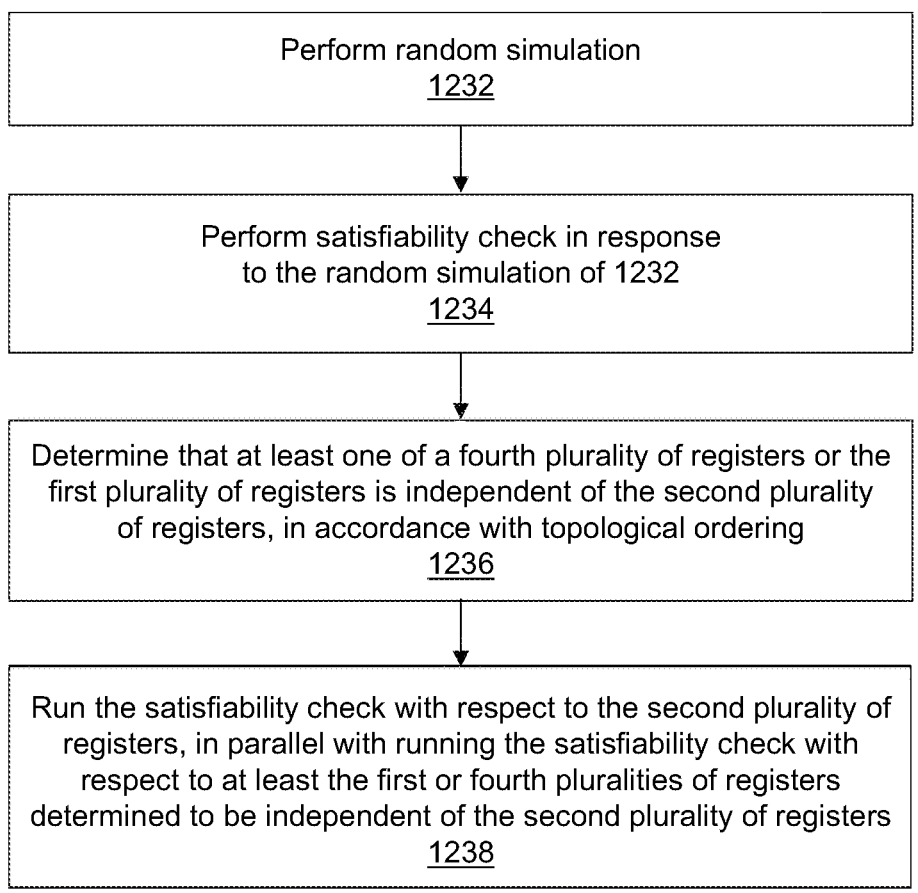
Figure 12C:
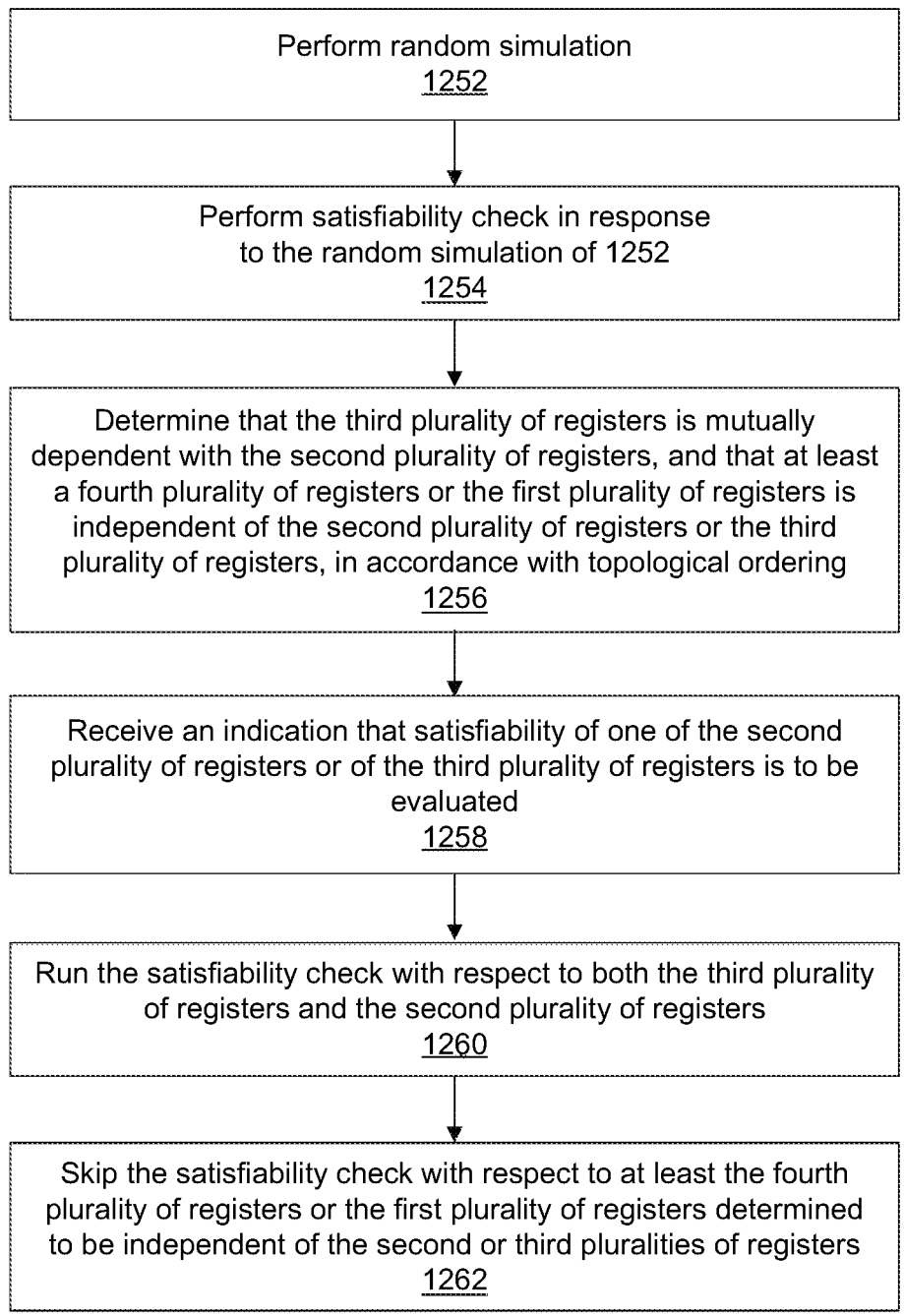

FIGS. 12A-12C are flowcharts illustrating an example logic-synthesis processes or methods 1200A-1200C, implementing various features of advanced register merging, according to some embodiments of the present disclosure. Processes/methods 1200A-1200C may be performed by processing logic that may comprise hardware (e.g., circuitry, dedicated logic, programmable logic, microcode, etc.), software (e.g., instructions executing on a processing device), or a combination thereof.

Process/method 1200A shall be described with reference to FIGS. 1-11 and 13-15. However, process/method 1200A is not limited only to those example embodiments. The steps of process/method 1200A may be performed by at least one computer processor coupled to at least one memory device. An example processor and memory device(s) are described below with respect to FIGS. 15, as 1502 and 1504 respectively. In some embodiments, process/method 1200A may be performed using computer system 1500 of FIG. 15, which may further include said at least one processor 1502 and memory 1504 such as those of FIG. 15.

In 1202, at least one processor 1502 may load at least one input, such as a file or similar data structure that includes an RTL description. In some embodiments, this loading may be via a database of RTL descriptions and/or via direct input from a user of an EDA tool, for example.

In 1204, processor 1502 may perform a first register-merging operation. The first register-merging operation may be configured to merge, into a first survivor register, a first plurality of registers of the RTL description. The first register-merging operation may involve certain other operations or steps described elsewhere herein, such as at FIGS. 2-9, for example.

In 1206, processor 1502 may output a first result of the first register-merging operation as a first output. The first output may include the first survivor register, such as in a representation of RTL or other suitable format or equivalent. The first output may, at a certain level of detail, resemble the merger of FIG. 1, according to some example embodiments.

In 1208, processor 1502 may perform a second register-merging operation. The second register-merging operation may be configured to merge, into a first equivalence class, a second plurality of registers that share a first functional equivalency based on the first output. The second register-merging operation may involve certain other operations or steps described elsewhere herein, such as at FIGS. 1-9, for instance, and may include additional representations such as those shown in FIGS. 4-9, according to some non-limiting examples.

In 1210, processor 1502 may verify equivalence of the second plurality of registers within the first equivalence class. For example, to verify equivalence of the second plurality of registers within the first equivalence class, other operations may be performed, including simulation and satisfiability checking as referenced and described elsewhere herein, including at FIGS. 10 and 11 with accompanying descriptions.

According to an embodiment, processor 1502 may perform a random simulation and a satisfiability check in response to the random simulation, such as shown in the example of FIG. 10 (see also 1232, 1234, 1252, and 1254 as described further below with respect to FIGS. 12B and 12C showing processes/methods 1200B and 1200C). According to some further embodiments, at least one register pair may be selected at random from the third plurality of registers, and the satisfiability check may be skipped for the at least one register pair.

According to an additional embodiment, processor 1502 may perform a third register-merging operation. The third register-merging operation may be configured to merge, into a second equivalence class, a third plurality of registers that share a second functional equivalency based on the first output. Any register in the first equivalence class may in turn be non-equivalent to any register in the second equivalence class. Determination of functional equivalency may be seen by way of examples shown in FIGS. 2-8 with accompanying descriptions, and equivalence classes are further described with respect to Listing 1 above and FIGS. 1-9 with accompanying descriptions, as well as various other examples described and referenced elsewhere herein According to some further embodiments, the first plurality of registers may be determined to be independent of the second plurality of registers, in accordance with a topological ordering. Here, the satisfiability check may be run with respect to both the first plurality of registers and the second plurality of registers, in parallel.

According to some further embodiments, the third plurality of registers may be determined to be mutually dependent with the second plurality of registers, and a fourth plurality of registers may be independent of the second plurality of registers or the third plurality of registers, in accordance with a topological ordering. Per an indication that satisfiability of one of the second plurality of registers or of the third plurality of registers is to be evaluated, the satisfiability check may be run with respect to both the third plurality of registers and the second plurality of registers, skipping the satisfiability check with respect to the fourth plurality of registers or the first plurality of registers determined to be independent of the second plurality of registers or the third plurality of registers.

Additionally, or alternatively, at least one register pair from the second plurality of registers may be classified as functionally equivalent. The classifying may include determining a shared clock for the at least one register pair, determining an equivalent response to a synchronous function for the at least one register pair, and determining an equivalent response to an asynchronous function for the at least one register pair, where any of the operations of determining may be performed via processor 1502.

Moreover, the first plurality of registers may, for example, share a net in common based on the RTL description. The second output may include at least one of a second RTL description, a gate-level hardware description, a serialized bit sequence, a parallel-channel input, or a combination thereof, according to some embodiments.

In 1214, processor 1502 may output at least one validation result of the circuit structure. Other examples and further details of the validation result outputs are described and referenced elsewhere herein.

Examples of how processor 1502 may perform any operations or steps of process/method 1200A are described further, such as with respect to FIGS. 1-11 and 13-15. Any or all of the above steps may be performed as part of embodiments as shown and described further with respect to FIGS. 1-11 and 13-15, in some embodiments. Additionally, or alternatively, any or all of the above steps may be performed as part of processing demonstrated in FIGS. 1-11 and 13-15, for example.

Not all steps of the process/method 1200A may be needed in all cases to perform the enhanced techniques disclosed herein. Further, some steps of process/method 1200A may be performed simultaneously, or in a different order from that shown in FIG. 12A, as will be understood by a person of ordinary skill in the art.

Process/method 1200B shall be described with reference to FIGS. 1-11 and 13-15. Process/method 1200B includes additional detail about the verifying described above with respect to 1212, according to some further embodiments. However, process/method 1200B is not limited only to those example embodiments. The steps of process/method 1200B may be performed by at least one computer processor coupled to at least one memory device. An example processor and memory device(s) are described below with respect to FIGS. 15, as 1502 and 1504 respectively. In some embodiments, process/method 1200B may be performed using computer system 1500 of FIG. 15, which may further include said at least one processor 1502 and memory 1504 such as those of FIG. 15.

In 1232, at least one processor 1502 may perform a random simulation. The random simulation may be part of an approximation phase of advanced register merging, as described above with respect to the top half of FIG. 10. Thus, any of the register-merging operations of process/method 1200A may be run, rerun, or otherwise evaluated using a relatively fast equivalence check in accordance with any selections made by the random simulation, as opposed to a relatively slow satisfiability check, according to some example use cases.

In 1234, processor 1502 may perform a satisfiability check in response to the random simulation of 1232. The satisfiability check may be part of a confirmation phase of advanced register merging. In other words, the satisfiability check may be a relatively slow satisfiability check as described above with respect to the bottom half of FIG. 10, according to some embodiments. However, following to the random simulation of 1232, with the overall reduction in number and/or size of equivalence classes or partitions of registers for evaluation, the total runtime of the satisfiability checking may be reduced overall. In some example use cases, the reductions of runtime overhead may be achieved with significant margins, as demonstrated in Table 1 provided herein.

In 1236, processor 1502 may determine, as part of the satisfiability check of 1234, that the first plurality of registers is independent of the second plurality of registers, in accordance with a topological ordering. This topological ordering, and any resultant determination of dependency or lack thereof, is described further above with respect to FIG. 11. A determination of dependency or mutual dependency may lead to different ordering of evaluations in partitions or equivalence classes where a change in an RTL input or equivalence value may require re-evaluation. However, independent register groups (e.g., equivalence classes, partitions, partition groups, etc.) may be evaluated in parallel (per 1238 as described further below with respect to this process/method 1200B), or may skip evaluations where not affected by a given change elsewhere to an independent part of a related RTL input or equivalence value (see also, e.g., 1262 of FIG. 12C with respect to process/method 1200C as described further below).

In 1238, at least one processor 1502 may run the satisfiability check with respect to both the first plurality of registers and the second plurality of registers, in parallel. As a result, the total runtime of the satisfiability checking may be further reduced overall. Likewise, in some example use cases, further reductions of runtime overhead may be achieved with significant margins, as demonstrated in Table 1 provided herein.

Not all steps of the process/method 1200B may be needed in all cases to perform the enhanced techniques disclosed herein. Further, some steps of process/method 1200B may be performed simultaneously, or in a different order from that shown in FIG. 12B, as will be understood by a person of ordinary skill in the art.

Process/method 1200C shall be described with reference to FIGS. 1-11 and 13-15. Process/method 1200C includes additional detail about the verifying described above with respect to 1212, additionally or alternatively according to some further embodiments. However, process/method 1200C is not limited only to those example embodiments. The steps of process/method 1200C may be performed by at least one computer processor coupled to at least one memory device. An example processor and memory device(s) are described below with respect to FIGS. 15, as 1502 and 1504 respectively. In some embodiments, process/method 1200C may be performed using computer system 1500 of FIG. 15, which may further include said at least one processor 1502 and memory 1504 such as those of FIG. 15.

In 1252, at least one processor 1502 may perform a random simulation. The random simulation may be part of an approximation phase of advanced register merging, as described above with respect to the top half of FIG. 10. Thus, any of the register-merging operations of process/method 1200A may be run, rerun, or otherwise evaluated using a relatively fast equivalence check in accordance with any selections made by the random simulation, as opposed to a relatively slow satisfiability check, according to some example use cases.

In 1254, processor 1502 may perform a satisfiability check in response to the random simulation of 1252. The satisfiability check may be part of a confirmation phase of advanced register merging. In other words, the satisfiability check may be a relatively slow satisfiability check as described above with respect to the bottom half of FIG. 10, according to some embodiments. However, following to the random simulation of 1252, with the overall reduction in number and/or size of equivalence classes or partitions of registers for evaluation, the total runtime of the satisfiability checking may be reduced overall. In some example use cases, the reductions of runtime overhead may be achieved with significant margins, as demonstrated in Table 1 provided herein.

In 1256, processor 1502 may determine, as part of the satisfiability check of 1254, that the third plurality of registers is mutually dependent with the second plurality of registers, and that a fourth plurality of registers is independent of the second plurality of registers or the third plurality of registers, in accordance with a topological ordering. This topological ordering, and any resultant determination of dependency or lack thereof, is described further above with respect to FIG. 11. A determination of dependency or mutual dependency may lead to different ordering of evaluations in partitions or equivalence classes where a change in an RTL input or equivalence value may require re-evaluation. However, independent register groups (e.g., equivalence classes, partitions, partition groups, etc.) may be evaluated in parallel (per 1238 as described further above with respect to this process/method 1200B), or may skip evaluations where not affected by a given change elsewhere to an independent part of a related RTL input or equivalence value (see also, e.g., 1262 as described further below).

In 1258, processor 1502 may receive an indication that satisfiability of one of the second plurality of registers or of the third plurality of registers is to be evaluated. This indication may be a result of, or otherwise indicative of, a dependency (e.g., the mutual dependency) between the second plurality of registers and the third plurality of registers, according to some embodiments. These second and third pluralities of registers may respectively correspond to separate equivalence classes, partitions, or partition groups, such as those described above with respect to FIG. 11, for example. Additionally, or alternatively, in an embodiment, the indication may be independently (or in combination with) a user input or configuration setting to perform an additional evaluation, e.g., for satisfiability.

In 1260, processor 1502 may run the satisfiability check with respect to both the third plurality of registers and the second plurality of registers, in accordance the topological order of any dependency or mutual dependency between the second and third pluralities of registers, and any other dependencies, according to some example embodiments. Further examples of this satisfiability checking can be found elsewhere herein, e.g., with respect to FIGS. 7-11.

In 1262, processor 1502 may skip the satisfiability check with respect to the fourth plurality of registers or the first plurality of registers determined to be independent of the second plurality of registers or the third plurality of registers. This skipping is due at least in part to the independence of the fourth plurality of registers from the second and third pluralities of registers, as determined at 1256, as described above. According to some embodiments, at least one register pair among the fourth plurality of registers may be skipped for the at least one register pair.

Not all steps of the process/method 1200C may be needed in all cases to perform the enhanced techniques disclosed herein. Further, some steps of process/method 1200C may be performed simultaneously, or in a different order from that shown in FIG. 12C, as will be understood by a person of ordinary skill in the art.

Figure 13:
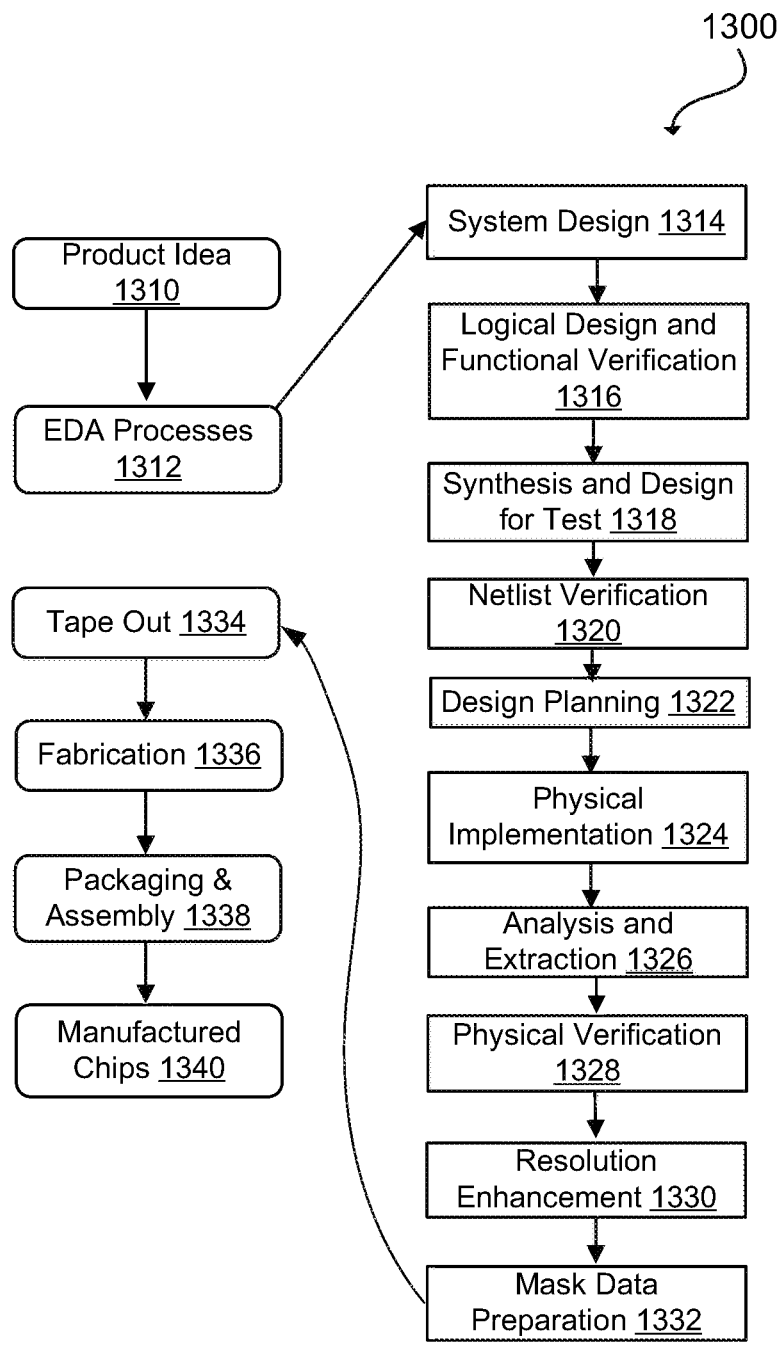
FIG. 13 depicts a flowchart of various processes used during the design and manufacture of an integrated circuit in accordance with some embodiments of the present disclosure.

FIG. 13 illustrates an example set of processes 1300 used during the design, verification, and fabrication of an article of manufacture such as an integrated circuit to transform and verify design data and instructions that represent the integrated circuit. Each of these processes may be structured and enabled as multiple modules or operations. The term 'EDA' signifies the term 'Electronic Design Automation.' These processes may start with the creation of a product idea at step 1310 with information supplied by a designer, information which may be transformed to create an article of manufacture that uses a set of EDA processes. When the design is finalized, the design may be taped-out at step 1334, which is when artwork (e.g., geometric patterns) for the integrated circuit may be sent to a fabrication facility to manufacture the mask set, which may then be used to manufacture the integrated circuit. After tape-out, a semiconductor die may be fabricated at step 1336 and packaging and assembly processes 1338 may be performed to produce the finished integrated circuit as shown at step 1340.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description may be transformed to a logic-level register-transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions may be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence as depicted in FIG. 13. The processes described may be enabled by EDA products or tools.

During system design 1314, functionality of an integrated circuit to be manufactured may be specified. The design may be optimized for desired characteristics such as power consumption, performance, area (physical and/or lines of code), and reduction of costs, etc. Partitioning of the design into different types of modules or components may occur at this stage.

During logic design and functional verification 1316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' may be used to speed up the functional verification.

During synthesis and design for test 1318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that may be used by an EDA product to verify that the integrated circuit, when manufactured, performs according to the specified design. The netlist may be optimized for a target semiconductor manufacturing technology. Additionally, the finished integrated circuit may be tested to verify that the integrated circuit satisfies the requirements of the specification.

During netlist verification 1320, the netlist may be checked for compliance with timing constraints and for correspondence with the HDL code. During design planning 1322, an overall floor plan for the integrated circuit may be constructed and analyzed for timing and top-level routing.

During layout or physical implementation 1324, physical placement (positioning of circuit components such as transistors or capacitors) and routing (connection of the circuit components by multiple conductors) may occur, and the selection of cells from a library to enable specific logic functions may also be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block may be referred to as a module or component and may be enabled as both physical structures and in simulations. Parameters may be specified for selected cells (based on 'standard cells') such as size and made accessible in a database for use by EDA products.

During analysis and extraction 1326, the circuit function may be verified at the layout level, which permits refinement of the layout design. During physical verification 1328, the layout design may be checked to ensure that manufacturing constraints are correct, such as DRC constraints, electrical constraints, lithographic constraints, and that circuitry function matches the HDL design specification. During resolution enhancement 1330, the geometry of the layout may be transformed to improve how the circuit design is manufactured.

During tape-out, data may be created to be used (after lithographic enhancements are applied if appropriate) for production of lithography masks. During mask data preparation 1332, the 'tape-out' data is used to produce lithography masks that are used to produce finished integrated circuits.

A storage subsystem of a computer system (such as computer system 1500 of FIG. 15, or host system 1407 of FIG. 14) may be used to store the programs and data structures that are used by some or all of the EDA products described herein, and products used for development of cells for the library and for physical and logical design that use the library.

Figure 14:
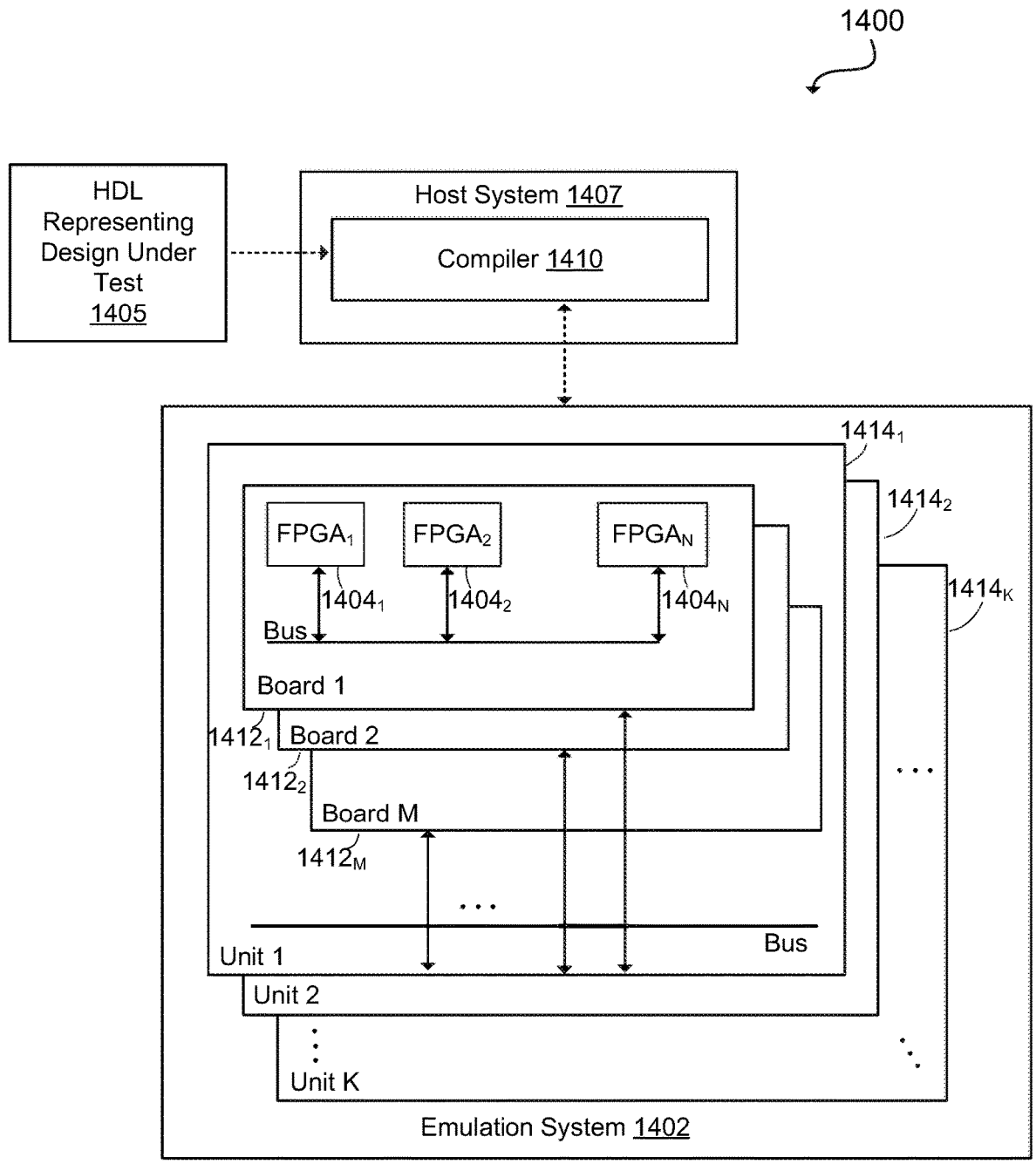
FIG. 14 depicts an abstract diagram of an example emulation system in accordance with some embodiments of the present disclosure.

FIG. 14 depicts an abstract diagram of an example emulation environment 1400. Emulation environment 1400 may be configured to verify the functionality of the circuit design. The emulation environment 1400 may include a host system 1407 (e.g., a computer that is part of an EDA system) and an emulation system 1402 (e.g., a set of programmable devices such as Field Programmable Gate Arrays (FPGAs) or processors). The host system may generate data and information by using a compiler 1410 to structure the emulation system to emulate a circuit design. A circuit design to be emulated may also be referred to as a Design Under Test ('DUT') where data and information from the emulation are used to verify the functionality of the DUT.

The host system 1407 may include one or more processors. In the embodiment where the host system includes multiple processors, the functions described herein as being performed by the host system may be distributed among the multiple processors. The host system 1407 may include a compiler 1410 to transform specifications written in a description language that represents a DUT and to produce data (e.g., binary data) and information that is used to structure the emulation system 1402 to emulate the DUT. The compiler 1410 may transform, change, restructure, add new functions to, and/or control the timing of the DUT.

The host system 1407 and emulation system 1402 exchange data and information using signals carried by an emulation connection. The connection may be, but is not limited to, one or more electrical cables such as cables with pin structures compatible with the Recommended Standard 232 (RS232) or universal serial bus (USB) protocols. The connection may be a wired communication medium or network such as a local area network or a wide area network such as the Internet. The connection may be a wireless communication medium or a network with one or more points of access using a wireless protocol such as BLUETOOTH or IEEE 1202.11. The host system 1407 and emulation system 1402 may exchange data and information through a third device such as a network server.

The emulation system 1402 may include multiple FPGAs (or other modules) such as FPGAs $1404_1$ and $1404_2$ as well as additional FPGAs to 1304N. Each FPGA may include one or more FPGA interfaces through which the FPGA may be connected to other FPGAs (and potentially other emulation components) for the FPGAs to exchange signals. An FPGA interface may be referred to as an input/output pin or an FPGA pad. While an emulator may include FPGAs, embodiments of emulators may include other types of logic blocks instead of, or along with, the FPGAs for emulating DUTs. For example, the emulation system 1402 may include custom FPGAs, specialized ASICs for emulation or prototyping, memories, and input/output devices.

A programmable device may include an array of programmable logic blocks and a hierarchy of interconnections that may enable the programmable logic blocks to be interconnected according to the descriptions in the HDL code. Each of the programmable logic blocks may enable complex combinational functions or enable logic gates such as AND, and XOR logic blocks. In some embodiments, the logic blocks also may include memory elements/devices, which may be simple latches, flip-flops, or other blocks of memory. Depending on the length of the interconnections between different logic blocks, signals may arrive at input terminals of the logic blocks at different times and thus may be temporarily stored in the memory elements/devices.

FPGAs $1404_1$-$1404_N$ may be placed onto one or more boards $1412_1$ and $1412_2$ as well as additional boards through $1412_M$. Multiple boards may be placed into an emulation unit $1414_1$. The boards within an emulation unit may be connected using the backplane of the emulation unit or any other types of connections. In addition, multiple emulation units (e.g., $1414_1$ and $1414_2$ through $1414_K$) may be connected to each other by cables or any other means to form a multi-emulation unit system.

For a DUT that is to be emulated, the host system 1407 may transmit one or more bit files to the emulation system 1402. The bit files may specify a description of the DUT and may further specify partitions of the DUT created by the host system 1407 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1407 receives a description of a DUT that is to be emulated. In some embodiments, the DUT description is in a description language (e.g., a register transfer language (RTL). In some embodiments, the DUT description is in netlist level files or a mix of netlist level files and HDL files. If part of the DUT description or the entire DUT description is in an HDL, then the host system may synthesize the DUT description to create a gate-level netlist using the DUT description. A host system may use the netlist of the DUT to partition the DUT into multiple partitions where one or more of the partitions include trace and injection logic. The trace and injection logic traces interface signals that are exchanged via the interfaces of an FPGA. Additionally, the trace and injection logic may inject traced interface signals into the logic of the FPGA. The host system may map each partition to an FPGA of the emulator. In some embodiments, the trace and injection logic may be included in select partitions for a group of FPGAs. The trace and injection logic may be built into one or more of the FPGAs of an emulator. The host system may synthesize multiplexers to be mapped into the FPGAs. The multiplexers may be used by the trace and injection logic to inject interface signals into the DUT logic.

The host system creates bit files describing each partition of the DUT and the mapping of the partitions to the FPGAs.

For partitions in which trace and injection logic are included, the bit files also describe the logic that is included. The bit files may include place and route information and design constraints. The host system may store the bit files and information describing which FPGAs are to emulate each component of the DUT (e.g., to which FPGAs each component is mapped).

Upon request, the host system may then transmit the bit files to the emulator. The host system may signal the emulator to start the emulation of the DUT. During emulation of the DUT or at the end of the emulation, the host system may receive emulation results from the emulator through the emulation connection. Emulation results may be data and information generated by the emulator during the emulation of the DUT which include interface signals and states of interface signals that have been traced by the trace and injection logic of each FPGA. The host system may store the emulation results and/or transmit the emulation results to another processing system.

After emulation of the DUT, a circuit designer may request to debug a component of the DUT. If such a request is made, the circuit designer may specify a time period of the emulation to debug. The host system may identify which FPGAs are emulating the component using the stored information. The host system may retrieve stored interface signals associated with the time period and traced by the trace and injection logic of each identified FPGA. The host system may signal the emulator to re-emulate the identified FPGAs. The host system may transmit the retrieved interface signals to the emulator to re-emulate the component for the specified time period. The trace and injection logic of each identified FPGA may inject its respective interface signals received from the host system into the logic of the DUT mapped to the FPGA. In case of multiple re-emulations of an FPGA, merging the results may produce a full debug view.

The host system may receive, from the emulation system, signals traced by logic of the identified FPGAs during the re-emulation of the component. The host system may store the signals received from the emulator. The signals traced during the re-emulation may have a higher sampling rate than the sampling rate during the initial emulation. For example, in the initial emulation a traced signal may include a saved state of the component every X milliseconds. However, in the re-emulation the traced signal may include a saved state every Y milliseconds where Y is less than X. If the circuit designer requests to view a waveform of a signal traced during the re-emulation, the host system may retrieve the stored signal and display a plot of the signal. For example, the host system may generate a waveform of the signal. Afterwards, the circuit designer may request to re-emulate the same component for a different time period or to re-emulate another component.

Host system 1407 and/or the compiler 1410 may include sub-systems such as, but not limited to, a design synthesizer sub-system, a mapping sub-system, a run time sub-system, a results sub-system, a debug sub-system, a waveform sub-system, and a storage sub-system. The sub-systems may be structured and enabled as individual or multiple modules or two or more may be structured as a module. Together these sub-systems structure the emulator and monitor the emulation results.

The design synthesizer sub-system may transform the HDL that is representing a DUT 1405 into gate level logic. For a DUT that is to be emulated, the design synthesizer sub-system receives a description of the DUT. If the description of the DUT is fully or partially in HDL (e.g., RTL or other level of abstraction), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic may be added to the DUT prior to the partitioning. For example, the trace and injection logic may be added by the design synthesizer sub-system prior to or after the synthesizing the HDL of the DUT.

In addition to including the trace and injection logic, the mapping sub-system may include additional tracing logic in a partition to trace the states of certain DUT components that are not traced by the trace and injection. The mapping sub-system may include the additional tracing logic in the DUT prior to the partitioning or in partitions after the partitioning. The design synthesizer sub-system may include the additional tracing logic in an HDL description of the DUT prior to synthesizing the HDL description.

The mapping sub-system may map each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files may include additional information such as constraints of the DUT and routing information of connections between FPGAs and connections within each FPGA. The mapping sub-system may generate a bit file for each partition of the DUT and may store the bit file in the storage sub-system. Upon request from a circuit designer, the mapping sub-system transmits the bit files to the emulator, and the emulator may use the bit files to structure the FPGAs to emulate the DUT.

If the emulator includes specialized ASICs that include the trace and injection logic, the mapping sub-system may generate a specific structure that connects the specialized ASICs to the DUT. In some embodiments, the mapping sub-system may save the information of the traced/injected signal and where the information is stored on the specialized ASIC.

The run time sub-system controls emulations performed by the emulator. The run time sub-system may cause the emulator to start or stop executing an emulation. Additionally, the run time sub-system may provide input signals and data to the emulator. The input signals may be provided directly to the emulator through the connection or indirectly through other input signal devices. For example, the host system may control an input signal device to provide the input signals to the emulator. The input signal device may be, for example, a test board (directly or through cables), signal generator, another emulator, or another host system.

The results sub-system may process emulation results generated by the emulator. During emulation and/or after completing the emulation, the results sub-system may receive emulation results from the emulator generated during the emulation. The emulation results may include signals traced during the emulation. Specifically, the emulation results may include interface signals traced by the trace and injection logic emulated by each FPGA and may include signals traced by additional logic included in the DUT. Each traced signal may span multiple cycles of the emulation. A traced signal may include multiple states and each state may be associated with a time of the emulation. The results sub-system stores the traced signals in the storage sub-system. For each stored signal, the results sub-system may store information indicating which FPGA generated the traced signal.

The debug sub-system may allow circuit designers to debug DUT components. After the emulator has emulated a DUT and the results sub-system has received the interface signals traced by the trace and injection logic during the emulation, a circuit designer may request to debug a component of the DUT by re-emulating the component for a specific time period. In a request to debug a component, the circuit designer may identify the component and indicate a time period of the emulation to debug. The circuit designer's request may include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system may retrieve, from the storage sub-system, interface signals traced by the trace and injection logic of the FPGA during the time period indicated by the circuit designer. For example, the debug sub-system retrieves states traced by the trace and injection logic that are associated with the time period.

The debug sub-system may transmit the retrieved interface signals to the emulator. The debug sub-system may instruct the debug sub-system to use the identified FPGAs and for the trace and injection logic of each identified FPGA to inject its respective traced signals into logic of the FPGA to re-emulate the component for the requested time period. The debug sub-system may further transmit the sampling rate provided by the circuit designer to the emulator so that the tracing logic traces states at the proper intervals.

To debug the component, the emulator may use the FPGAs to which the component has been mapped. Additionally, the re-emulation of the component may be performed at any point specified by the circuit designer.

For an identified FPGA, the debug sub-system may transmit instructions to the emulator to load multiple emulator FPGAs with the same configuration of the identified FPGA. The debug sub-system additionally signals the emulator to use the multiple FPGAs in parallel. Each FPGA from the multiple FPGAs may be used with a different time window of the interface signals to generate a larger time window in a shorter amount of time. For example, the identified FPGA may require an hour or more to use a certain amount of cycles. However, if multiple FPGAs have the same data and structure of the identified FPGA and each of these FPGAs runs a subset of the cycles, the emulator may require a few minutes for the FPGAs to collectively use all the cycles.

A circuit designer may identify a hierarchy or a list of DUT signals to re-emulate. To enable this, the debug sub-system determines the FPGA needed to emulate the hierarchy or list of signals, retrieves the necessary interface signals, and may transmit the retrieved interface signals to the emulator for re-emulation. Thus, a circuit designer may identify any element (e.g., component, device, or signal) of the DUT to debug/re-emulate.

The waveform sub-system may generate waveforms using the traced signals. If a circuit designer requests to view a waveform of a signal traced during an emulation run, the host system retrieves the signal from the storage sub-system. The waveform sub-system may display a plot of the signal. For one or more signals, when the signals are received from the emulator, the waveform sub-system may automatically generate the plots of the signals.

Figure 15:
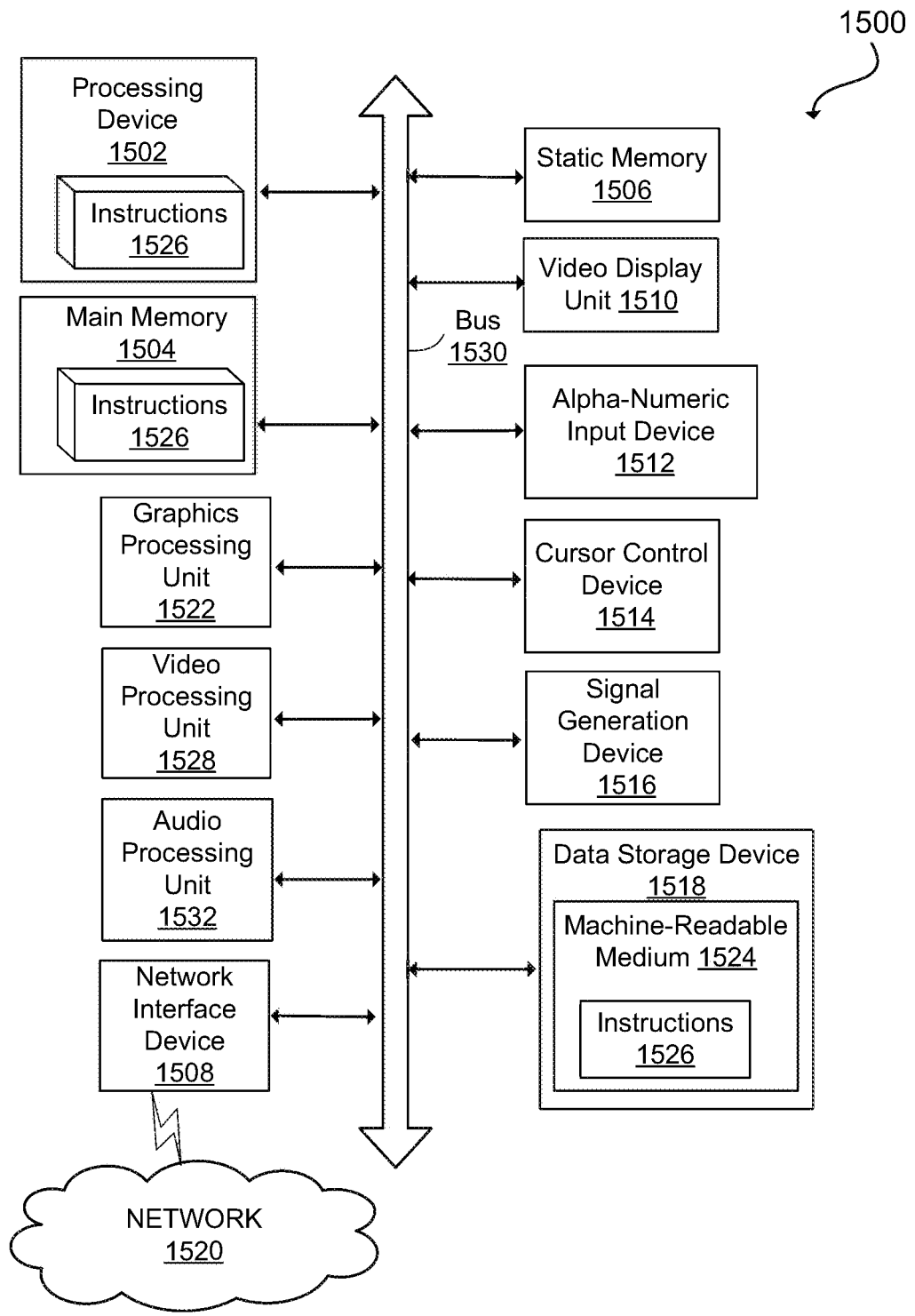
FIG. 15 shows an example computer system, according to some embodiments.

FIG. 15 illustrates an example machine of a computer system 1500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1500 includes a processing device 1502, a main memory 1504 (e.g., read-only memory (ROM), flash memory, dynamic random access memory (DRAM) such as synchronous DRAM (SDRAM), a static memory 1506 (e.g., flash memory, static random access memory (SRAM), etc.), and a data storage device 1518, which may communicate with each other via a bus 1530.

Processing device 1502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1502 may also be one or more special-purpose processing devices such as an application specific integrated circuit (ASIC), a field programmable gate array (FPGA), a digital signal processor (DSP), network processor, or the like. The processing device 1402 may be configured to execute instructions 1526 for performing the operations and steps described herein.

The computer system 1500 may further include a network interface device 1508 to communicate over the network 1520. The computer system 1500 also may include a video display unit 1510 (e.g., a liquid crystal display (LCD) or a cathode ray tube (CRT)), an alphanumeric input device 1512 (e.g., a keyboard), a cursor control device 1514 (e.g., a mouse), a graphics processing unit 1522, a signal generation device 1516 (e.g., a speaker), graphics processing unit 1522, video processing unit 1528, and audio processing unit 1532.

The data storage device 1518 may include a machine-readable storage medium 1524 (also known as a non-transitory computer-readable storage medium) on which may be stored one or more sets of instructions 1526 or software embodying any one or more of the methodologies or functions described herein. The instructions 1526 may also reside, completely or at least partially, within the main memory 1504 and/or within the processing device 1502 during execution thereof by the computer system 1500, the main memory 1504 and the processing device 1502 also constituting machine-readable storage media.

In some implementations, the instructions 1526 may include instructions to implement functionality corresponding to the present disclosure. While the machine-readable storage medium 1524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element may be depicted in the figures and like elements are labeled with like numerals. The disclosure and drawings are, accordingly, to be regarded in an illustrative sense rather than a restrictive sense.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element may be depicted in the figures and like elements are labeled with like numerals. The disclosure and drawings are, accordingly, to be regarded in an illustrative sense rather than a restrictive sense.

What is claimed is:

1. A logic-synthesis method, comprising:
   loading a register-transfer level (RTL) description;
   performing a first register-merging operation, configured to merge, into a first survivor register, a first plurality of registers of the RTL description;
   outputting a first result of the first register-merging operation as a first output, comprising the first survivor register;
   performing, via at least one computer processor, a second register-merging operation configured to merge, into a first equivalence class, a second plurality of registers that share a first functional equivalency based on the first output;
   verifying, via the at least one computer processor, equivalence of the second plurality of registers within the first equivalence class; and
   outputting at least the first equivalence class, in response to the verifying, as a second output comprising a second survivor register.

2. The logic-synthesis method of claim 1, wherein the verifying further comprises:
   performing, via the at least one computer processor, a random simulation; and performing a satisfiability check in response to the random simulation.

3. The logic-synthesis method of claim 2, further comprising:
performing, via the at least one computer processor, a third register-merging operation, configured to merge, into a second equivalence class, a third plurality of registers that share a second functional equivalency based on the first output, wherein any register in the first equivalence class is non-equivalent to any register in the second equivalence class.

4. The logic-synthesis method of claim 3, wherein the verifying further comprises:
selecting, via the at least one computer processor, at least one register pair at random from the third plurality of registers; and
skipping the satisfiability check for the at least one register pair.

5. The logic-synthesis method of claim 3, wherein the performing the satisfiability check further comprises:
determining, via the at least one computer processor, that the third plurality of registers is mutually dependent with the second plurality of registers, and that at least one of a fourth plurality of registers or the first plurality of registers is independent of the second plurality of registers or the third plurality of registers, in accordance with a topological ordering;
receiving, via the at least one computer processor, an indication that satisfiability of one of the second plurality of registers or of the third plurality of registers is to be evaluated;
running the satisfiability check with respect to both the third plurality of registers and the second plurality of registers; and
skipping the satisfiability check with respect to the at least one of the fourth plurality of registers or the first plurality of registers determined to be independent of the second plurality of registers or the third plurality of registers.

6. The logic-synthesis method of claim 2, wherein the performing the satisfiability check further comprises:
determining, via the at least one computer processor, that at least one of a fourth plurality of registers or the first plurality of registers is independent of the second plurality of registers, in accordance with a topological ordering; and
running, via the at least one computer processor, the satisfiability check with respect to the at least one of the fourth plurality of registers or the first plurality of registers determined to be independent of the second plurality of registers, in parallel with running the satisfiability check with respect to the second plurality of registers.

7. The logic-synthesis method of claim 1, further comprising:
classifying, via the at least one computer processor, at least one register pair from the second plurality of registers as functionally equivalent.

8. The logic-synthesis method of claim 7, wherein the classifying further comprises:
determining, via the at least one computer processor, a shared clock for the at least one register pair;
determining, via the at least one computer processor, an equivalent response to a synchronous function for the at least one register pair; and determining, via the at least one computer processor, an equivalent response to an asynchronous function for the at least one register pair.

9. The logic-synthesis method of claim 1, wherein the second output comprises at least one of a second RTL description, a gate-level hardware description, a serialized bit sequence, a parallel-channel output, or a combination thereof.

10. The logic-synthesis method of claim 1, wherein the first plurality of registers share a net in common based on the RTL description.

11. A non-transitory computer-readable storage medium storing instructions that, when executed by at least one computer processor, cause the at least one computer processor to perform operations comprising:
loading a register-transfer level (RTL) description;
performing a first register-merging operation, configured to merge, into a first survivor register, a first plurality of registers of the RTL description;
outputting a first result of the first register-merging operation as a first output, comprising the first survivor register;
performing a second register-merging operation configured to merge, into a first equivalence class, a second plurality of registers that share a first functional equivalency based on the first output;
verifying equivalence of the second plurality of registers within the first equivalence class; and
outputting at least the first equivalence class, in response to the verifying, as a second output comprising a second survivor register.

12. The non-transitory computer-readable storage medium of claim 11, wherein the verifying further comprises:
performing a random simulation; and
performing a satisfiability check in response to the random simulation.

13. The non-transitory computer-readable storage medium of claim 12, the operations further comprising:
performing a third register-merging operation, configured to merge, into a second equivalence class, a third plurality of registers that share a second functional equivalency based on the first output, wherein any register in the first equivalence class is non-equivalent to any register in the second equivalence class.

14. The non-transitory computer-readable storage medium of claim 13, wherein the verifying further comprises:
selecting at least one register pair at random from the third plurality of registers; and
skipping the satisfiability check for the at least one register pair.

15. The non-transitory computer-readable storage medium of claim 13, wherein the performing the satisfiability check further comprises:
determining that the third plurality of registers is mutually dependent with the second plurality of registers, and that at least one of a fourth plurality of registers or the first plurality of registers is independent of the second plurality of registers or the third plurality of registers, in accordance with a topological ordering;
receiving an indication that satisfiability of one of the second plurality of registers or of the third plurality of registers is to be evaluated;
running the satisfiability check with respect to both the third plurality of registers and the second plurality of registers; and skipping the satisfiability check with respect to the at least one of the fourth plurality of registers or the first plurality of registers determined to be independent of the second plurality of registers or the third plurality of registers.

16. The non-transitory computer-readable storage medium of claim 12, wherein the performing the satisfiability check further comprises:
determining that at least one of a fourth plurality of registers or the first plurality of registers is independent of the second plurality of registers, in accordance with a topological ordering; and
running the satisfiability check with respect to the at least one of the fourth plurality of registers or the first plurality of registers determined to be independent of the second plurality of registers, in parallel with running the satisfiability check with respect to the second plurality of registers.

17. The non-transitory computer-readable storage medium of claim 11, the operations further comprising:
classifying at least one register pair from the second plurality of registers as functionally equivalent.

18. The non-transitory computer-readable storage medium of claim 17, wherein the classifying further comprises:
determining a shared clock for the at least one register pair;
determining an equivalent response to a synchronous function for the at least one register pair; and
determining an equivalent response to an asynchronous function for the at least one register pair.

19. The non-transitory computer-readable storage medium of claim 11, wherein the second output comprises at least one of a second RTL description, a gate-level hardware description, a serialized bit sequence, a parallel-channel output, or a combination thereof.

20. The non-transitory computer-readable storage medium of claim 11, wherein the first plurality of registers share a net in common based on the RTL description.

21. A system, comprising:
a memory; and
at least one computer processor coupled to the memory and configured to perform operations comprising:
loading a register-transfer level (RTL) description;
performing a first register-merging operation, configured to merge, into a first survivor register, a first plurality of registers of the RTL description;
outputting a first result of the first register-merging operation as a first output, comprising the first survivor register;
performing a second register-merging operation configured to merge, into a first equivalence class, a second plurality of registers that share a first functional equivalency based on the first output;
verifying equivalence of the second plurality of registers within the first equivalence class; and
outputting at least the first equivalence class, in response to the verifying, as a second output comprising a second survivor register.

22. The system of claim 21, wherein the verifying further comprises:
performing a random simulation; and
performing a satisfiability check in response to the random simulation.

23. The system of claim 22, the operations further comprising:
performing a third register-merging operation, configured to merge, into a second equivalence class, a third plurality of registers that share a second functional equivalency based on the first output, wherein any register in the first equivalence class is non-equivalent to any register in the second equivalence class.

24. The system of claim 23, wherein the verifying further comprises:
selecting at least one register pair at random from the third plurality of registers; and
skipping the satisfiability check for the at least one register pair.

25. The system of claim 23, wherein the performing the satisfiability check further comprises:
determining that the third plurality of registers is mutually dependent with the second plurality of registers, and that at least one of a fourth plurality of registers or the first plurality of registers is independent of the second plurality of registers or the third plurality of registers, in accordance with a topological ordering;
receiving an indication that satisfiability of one of the second plurality of registers or of the third plurality of registers is to be evaluated;
running the satisfiability check with respect to both the third plurality of registers and the second plurality of registers; and
skipping the satisfiability check with respect to the at least one of the fourth plurality of registers or the first plurality of registers determined to be independent of the second plurality of registers or the third plurality of registers.

26. The system of claim 22, wherein the performing the satisfiability check further comprises:
determining that at least one of a fourth plurality of registers or the first plurality of registers is independent of the second plurality of registers, in accordance with a topological ordering; and
running the satisfiability check with respect to the at least one of the fourth plurality of registers or the first plurality of registers determined to be independent of the second plurality of registers, in parallel with running the satisfiability check with respect to the second plurality of registers.

27. The system of claim 21, the operations further comprising:
classifying at least one register pair from the second plurality of registers as functionally equivalent.

28. The system of claim 27, wherein the classifying further comprises:
determining a shared clock for the at least one register pair;
determining an equivalent response to a synchronous function for the at least one register pair; and
determining an equivalent response to an asynchronous function for the at least one register pair.

29. The system of claim 21, wherein the second output comprises at least one of a second RTL description, a gate-level hardware description, a serialized bit sequence, a parallel-channel output, or a combination thereof.

30. The system of claim 21, wherein the first plurality of registers share a net in common based on the RTL description.

* * * * *